US007705330B2

(12) United States Patent
Nakao

(10) Patent No.: US 7,705,330 B2

(45) Date of Patent: Apr. 27, 2010

(54) ELECTRON BEAM IRRADIATION DEVICE

(75) Inventor: Seitaro Nakao, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 1026 days.

(21) Appl. No.: 11/277,156

(22) Filed: Mar. 22, 2006

(65) Prior Publication Data

US 2006/0272579 A1 Dec. 7, 2006

(30) Foreign Application Priority Data

Mar. 25, 2005 (JP) ............................ 2005-090159

(51) Int. Cl.
*H01J 37/30* (2006.01)
*G21K 5/00* (2006.01)
*C23C 16/48* (2006.01)
*C23C 16/00* (2006.01)

(52) U.S. Cl. ............ 250/492.3; 250/492.1; 315/111.81; 315/111.01; 118/723 EB; 118/715; 118/718

(58) Field of Classification Search ................. 118/718, 118/723 EB, 715; 250/492.1, 492.3, 493.1; 315/111.81, 111.01
See application file for complete search history.

(56) References Cited

U.S. PATENT DOCUMENTS

2004/0013817 A1* 1/2004 Mizutani et al. ............ 427/569
2006/0163499 A1* 7/2006 Echigo et al. .......... 250/492.22
2006/0272579 A1* 12/2006 Nakao .................. 118/723 EB
2007/0205381 A1* 9/2007 Nakao ..................... 250/492.3

FOREIGN PATENT DOCUMENTS

JP 63-8440 2/1988
JP 5-60899 3/1993
JP 6-80200 11/1994

* cited by examiner

*Primary Examiner*—Jeffrie R Lund
(74) *Attorney, Agent, or Firm*—Ladas & Parry LLP

(57) ABSTRACT

To provide an electron beam irradiation device capable of reducing quantity of inert gas consumed while maintaining oxygen concentration in an irradiation chamber in appropriate level. An electron beam irradiation device to irradiate an electron beam to an irradiated object passing through an irradiation chamber while introducing inert gas into the irradiation chamber comprising an oxygen concentration detection device to detect oxygen concentration in the irradiation chamber; a main controlling valve to regulate flow rate of inert gas introduced in the irradiation chamber; a control unit to control valve travel of the main controlling valve so that the flow rate of the inert gas decreases when the oxygen concentration becomes low on the basis of the oxygen concentration detected by the oxygen concentration detection device.

1 Claim, 5 Drawing Sheets

ELECTRON BEAM IRRADIATION DEVICE

BACKGROUND OF THE INVENTION

1. Field of the Invention

The present invention relates to an electron beam irradiation device to irradiate an electron beam to an irradiated object which passing an irradiation chamber while introducing inert gas in the irradiation chamber.

2. Description of the Related Art

There is known an electron beam irradiation device to irradiate an electron beam to a belt-shaped irradiated object such as a resin film and to conduct a processing such as bridging, hardening or reforming to the irradiated object. In this kind of irradiation device, when the electron beam is irradiated under the environment in which oxygen is exist, the inconvenience which the oxygen reacts to the electron beam and the irradiation energy of the electron beam is used sometimes occur. Therefore, as described in JP-B 63-8440, JP-A 5-60899 and JP-U 6-80200 for example, inert gas such as nitrogen is introduced in the irradiation chamber of the electron beam, and the oxygen is substituted for the inert gas, thereby the oxygen concentration in the irradiation chamber is restrained in a low level (less than 100 ppm, for example).

However, in the above-described electron beam irradiation device, the inert gas is continuously supplied in a constant flow rate, thus the quantity of the inert gas consumed is grate, and sometimes excess inert gas is introduced. For example, in the electron beam irradiation device of the type which irradiates an electron beam while making the irradiated object travel, the air which is going to enter the irradiation chamber accompanying the irradiated object is need to be removed out of the irradiation chamber by stripping it off with the inert gas, for that purpose, at the entrance of the irradiation chamber, a large quantity of the inert gas must be bowed to the irradiated object continuously. However, when the irradiated object is stopped or when the irradiated object is traveled for an arranging operation at a speed lower than when the electron beam is irradiated, the involving of the accompanying air does not exist or even if it exists the influence is small, therefore, if the inert gas is continuously introduced at the same flow rate as when the electron beam is irradiated, the inert gas is consumed vainly.

SUMMARY OF THE INVENTION

An object of the present invention is to provide an electron beam irradiation device capable of reducing quantity of inert gas consumed while maintaining oxygen concentration in an irradiation chamber in appropriate level.

To achieve the above-described object, an electron beam irradiation device according to one embodiment of the present invention is an electron beam irradiation device to irradiate an electron beam to an irradiated object passing through an irradiation chamber while introducing inert gas into the irradiation chamber, comprising: an oxygen concentration detection device to detect oxygen concentration in the irradiation chamber; a flow regulating valve to regulate flow rate of the inert gas introducing in the irradiation chamber; and a valve travel control device to control valve travel of the flow regulating valve on the basis of the oxygen concentration detected by the oxygen concentration detection device so that the flow rate of the inert gas decreases when the oxygen concentration becomes low.

According to the electron beam irradiation device, by controlling the valve travel of the flow regulating valve on the basis of the oxygen concentration in the irradiation chamber, the flow rate of the inert gas introduced into the irradiation chamber may be changed adequately depending on the oxygen concentration in the irradiation chamber. That is, when the oxygen concentration is in an upward tendency, by making the valve travel of the flow regulating valve bigger to increase the flow rate of the inert gas, the rising which exceeds an allowable limit of the oxygen concentration can be prevented. On the other hand, when the oxygen concentration is lower than required, by reducing the valve travel of the flow regulating valve to decrease a flow rate of the inert gas, the state that the inert gas is introduced excessively is overcome. Thereby, wasteful consumption of the inert gas is suppressed while the oxygen concentration in the irradiation chamber is maintained in a permissible level, and the quantity of the inert gas consumed can be reduced.

In one embodiment of the present invention, the valve travel control device may change the relation between the oxygen concentration and the valve travel of the flow regulating valve corresponding to the traveling speed so that flow rate of the inert gas for the same oxygen concentration when traveling speed of the irradiated object is high becomes relatively bigger than the flow rate when the traveling speed is low. When the traveling speed of the irradiated object is low, the flow rate of the air which is going to enter the irradiation chamber accompanying the irradiated object is small and the change in the oxygen concentration is also comparatively gentle, but if the traveling speed of the irradiated object becomes high, the flow rate of the air accompanying the irradiated object increases, and the change in the oxygen concentration occurs comparatively suddenly. In this case, even if the rise of the oxygen concentration is detected and the valve travel of the flow regulating valve is increased, there is risk that the control will be late. To the contrary, even in the same oxygen concentration, when the traveling speed of the irradiated object is high, if the flow rate of the inert gas is made to be relatively increased compared to when the speed is low, the extra flow rate of the inert gas is generated, a sudden rise of the oxygen concentration can be suppressed. In this embodiment, the case when the traveling speed is low is a concept including the state when traveling speed is 0, that is the case which the irradiated object stops.

In one embodiment of the present invention, a plurality of gas intake openings may be provided in the irradiation chamber, sampling pipe lines may be connected to each of the plurality of gas intake openings, the oxygen concentration detection device may be provided on each of the sampling pipe lines, the valve travel control device may judge oxygen concentration in the irradiation chamber on the basis of the detected value of the oxygen concentration in the gas taken in each sampling pipe line, and a valve travel of the flow regulating valve may be controlled on the basis of the judged oxygen concentration. According to this embodiment, because the gas in the irradiation chamber is taken from each of a plurality of gas intake openings and the oxygen concentration is detected, comparing to the case when the oxygen concentration is detected at one place of the irradiation chamber, the oxygen concentration in the irradiation chamber can be detected in high precise. In this case, a plurality of gas intake openings may line in the width direction of the irradiated object. Thereby, a partial rise of the oxygen concentration about the width direction of the irradiated object is reflected to flow control of the inert gas, and dispersion in the irradiation quality of the electron beam in the width direction can be controlled surely. Further, the plurality of gas intake openings may be arranged adjacent to a transmission window of the electron beam on the irradiation chamber. By arranging the gas intake openings in this way, the oxygen concentration in the electron beam in the neighbor of the irradiation position can be reflected to the flow rate of the inert gas, and then the flow rate of the inert gas can be controlled optimally.

In one embodiment of the present invention, each sampling pipe line is provided with a filter and the oxygen concentration detection device may be arranged at the downstream of the filter. By arranging the oxygen concentration detection device at the downstream of the filter, even the environment that dust such as paper powder is generated from the irradiated object come along with the irradiation of the electron beam, the dust can be removed by the filter and the oxygen concentration in the irradiation chamber can be detected precisely.

Further, a pressure detection devices is provided at the down stream of the filter of each sampling pipe line, and a filter monitoring device to judge the presence of a clogging of each filter on the basis of the pressure detected by the pressure detection device is further provided, the valve travel control device excludes the detected value of the oxygen concentration detected by the oxygen concentration detection device of the sampling pipe line judged as the filter is clogged from an object for judging oxygen concentration in the irradiation chamber, and the oxygen concentration in the irradiation chamber may be judged on the basis of the detected value of the oxygen concentration detected by remaining oxygen concentration detection devices. According to this embodiment, when an error occurs in the detected value of the oxygen concentration due to the clogging of the filter, the influence which the error impart to the flow control of the inert gas can be removed.

In one embodiment of the present invention, a pressure detection device can be provided at the downstream of the filter of each sampling pipe line and, and further, a filter monitoring device to judge presence of a clogging of each filter on the basis of the pressure detected by the pressure detection device, and an alarm device outputs a predetermined alarm when it is judged that a clogging occurs in the filter may be provided. According to the embodiment, the clogging of the filter is warned to the operator of the electron beam irradiation device and the maintenance of the filter can be promoted.

In one embodiment of the present invention: an introduction portion continued to the feed-in opening of the irradiated object and a processing portion in which width of the passage thereof is made wider than the introduction portion and comprises a transmission window of the electron beam may be provided on the irradiation chamber; blowing openings of the inert gas may be provided on the introduction portion and the processing portion respectively; the flow regulating valve may be provided to a main pipe line connecting a supplying source of the inert gas and each blowing opening, a control valve for branch pipe line to regulate flow rate of the inert gas may be provided on the branch pipe line which distributes inert gas from the main line to the blowing opening of the introduction portion; and as well as valve travel control of the flow regulating valve on the basis of the oxygen concentration, the valve travel control device may decrease the valve travel of the control valve for branch pipe line when the irradiated object is stopped. Blowing opening of the introduction portion generates the effect which strip the air going to enter the irradiation chamber accompanying the irradiated object and push it out of the chamber by the inert gas blowing from that, but the accompanying air does not enter when the irradiated object is stopped, thus it is not necessary to make such an effect occur. Therefore, by decreasing the valve travel of the control valve for branch pipe line corresponding to the blowing opening of the introduction portion when the irradiated object is stopped, wasteful consumption of the inert gas can be suppressed and the quantity of consumed can be further reduced. In this case, the decreasing of the valve travel of the control valve for the branch pipe line may be generated by controlling the control valve for branch pipe line to the fully-closed state of or may be generated by decreasing the valve travel to the extent not to reach the fully-closed state in comparison with when it is not stopped.

An electron beam irradiation device according to another aspect of the present invention is an electron beam irradiation device to irradiate electron beam to the irradiated object passing through an irradiation chamber while introducing inert gas in irradiation chamber comprising: a sampling pipe line connected to a gas intake opening provided on the irradiation chamber and to take gas of the irradiation chamber; a filter provided on the sampling pipe line; a pressure detecting device to detect pressure at the downstream of the filter; an oxygen concentration detecting device to detect oxygen concentration in the gas led to the downstream of the filter; a filter monitoring device to judge presence of a clogging of each filter on the basis of the pressure detected by the pressure detection device; and an alarm device to output a predetermined alarm when it is judged that a clogging occurs in the filter.

According to the electron beam irradiation device of this aspect, the oxygen concentration in the irradiation chamber can be monitored by utilizing the oxygen concentration detection device. As the oxygen concentration detection device is provided at the downstream of the filter, even in the environment in which the dust such as paper powder occur from the irradiated object come along with the irradiation of the electron beam, the filter can remove the dust and the oxygen concentration in the irradiation chamber can be detected precisely. Further, because the clogging of the filter can be judged from detected value of the pressure detection device and an alarm can be output, the maintenance of the filter is promoted to the operator, and the risk that the state which an error is generated in the detected value of the oxygen concentration by clogging of the filter is left can be removed.

BRIEF DESCRIPTION OF THE DRAWINGS

In the drawings attached.

DETAILED DESCRIPTION OF THE PREFERRED EMBODIMENT

Figure 1:
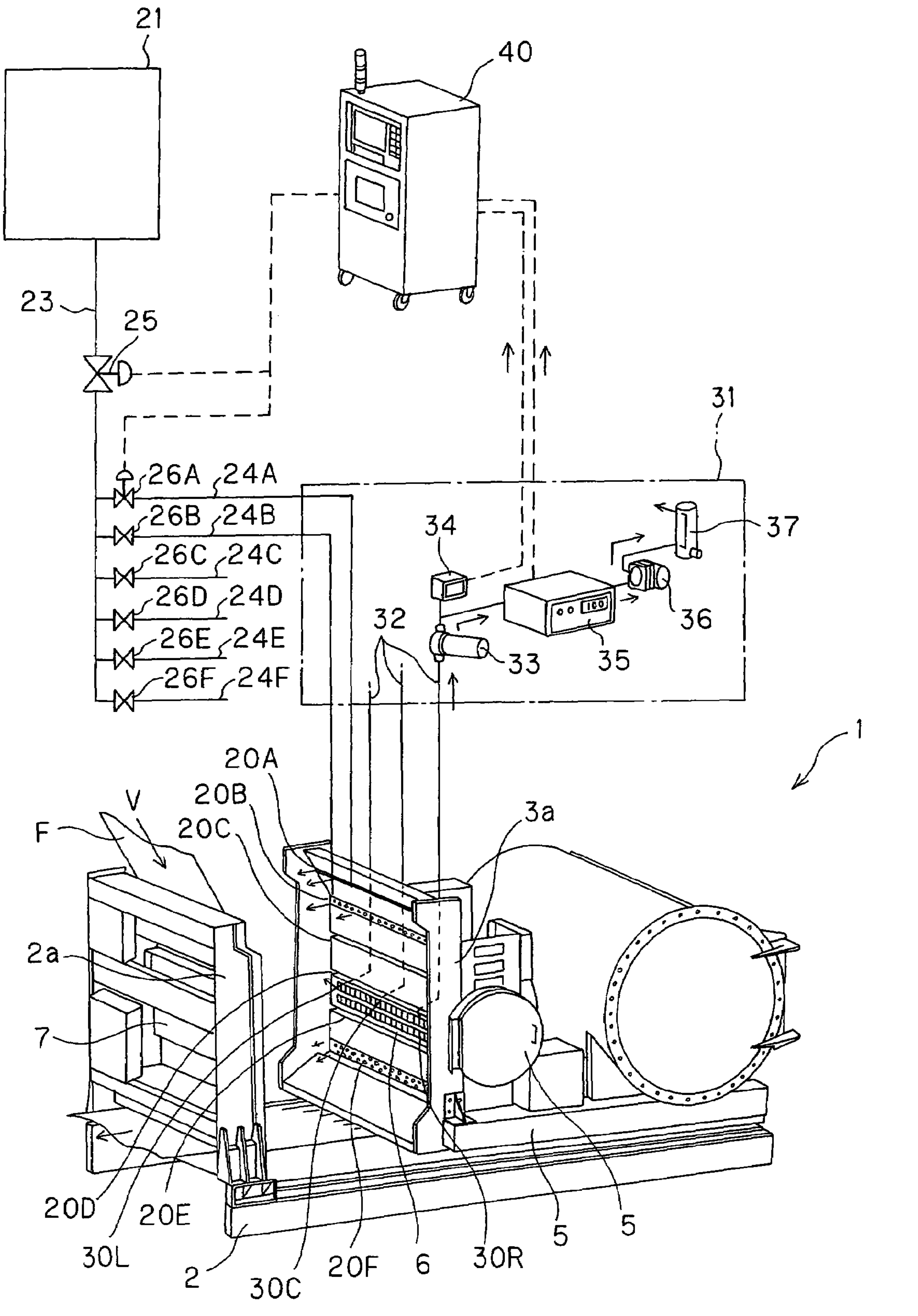
FIG. 1 is a view showing a main portion of an electron beam irradiation device according to one embodiment of the present invention.

FIG. 1 is a view showing a main portion of an electron beam irradiation device according to one embodiment of the present invention. An electron beam irradiation device 1 comprises a fixed unit 2 installed on factory floors, and a movable unit 3 installed on the fixed unit 2. It is provided a rigid wall 2*a* at one end of the fixed unit 2, and it is provided a pair of rails 2*b* in front of the rigid wall 2*a*. The movable unit 3 is provided along the rails 2*b* movably, and a movable wall 3*a* facing to the rigid wall 2*a* is provided at one end thereof. The movable unit 3 advances toward the rigid wall 2*a*, and the movable wall 3*a* is made to be combined with the rigid wall 2*a*, then the irradiation chamber 4 of the electron beam is formed between both walls 2*a*, 3*a* (cf. FIG. 2). FIG. 1 shows the state that the movable unit 3 is moved back from the rigid wall 2*a*, and the irradiation chamber 4 is opened. It is provided an electron beam generator 5 to generate electron beam at the rear of the movable wall 3*a* of the movable unit 3. The electron beam emitted from the electron beam generator 5 is incident to the irradiation chamber 4 through a transmission window 6 provided on the movable wall 3*a*, and is caught by an electron beam capture device 7 of the rigid wall 2*a*.

Figure 2:
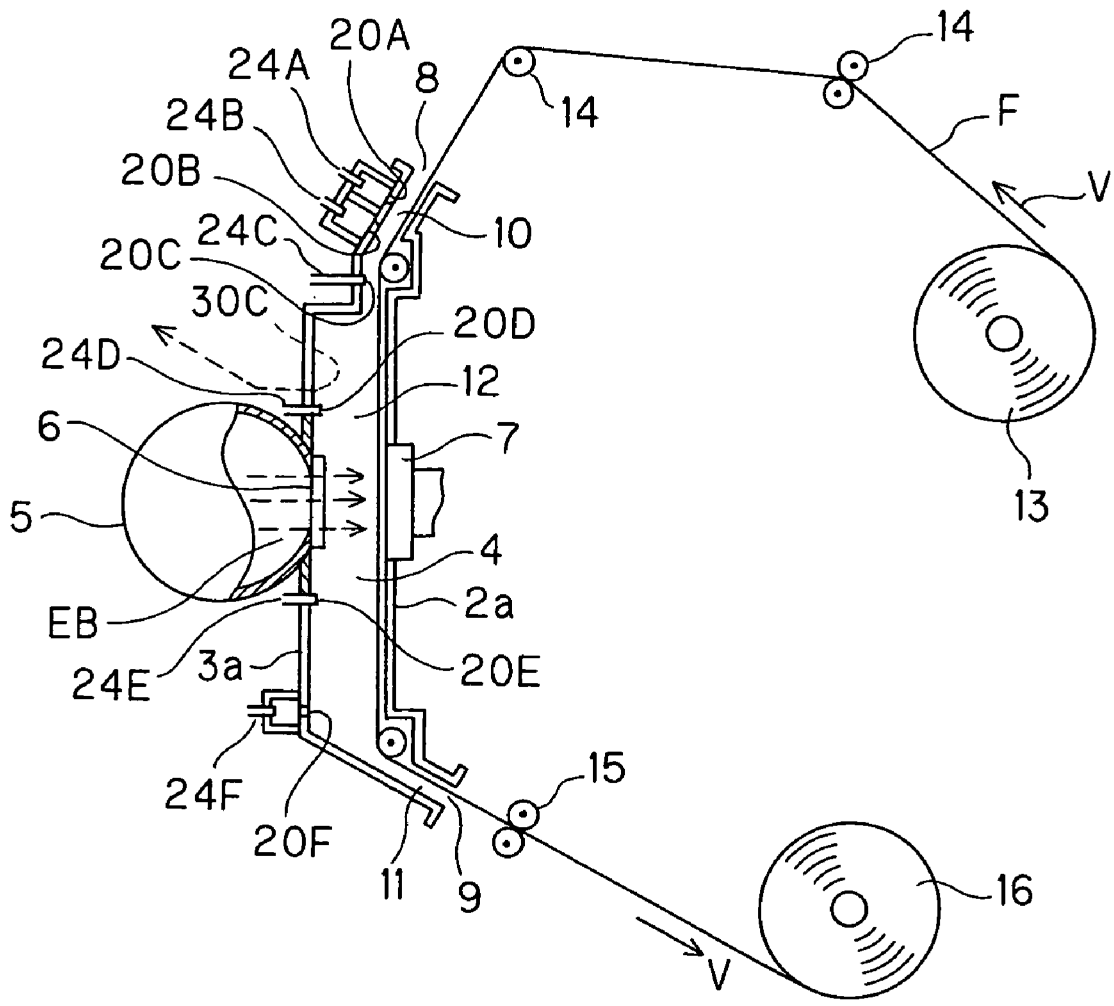
FIG. 2 is a sectional view showing a configuration of the irradiation chamber.

As show in the FIG. 2, it is provided a feed-in opening 8 to which film F as an irradiated object is fed in at one end (an upper end) of the irradiation chamber 4, and a feed-out opening 9 from which film F is fed out at another end (a bottom end) of the irradiation chamber 4. In the state that the rigid wall 2*a* and the movable wall 3*a* are made to be combined together, the irradiation chamber 4 is constructed as a closed space which the perimeter thereof is closed except both openings 8, 9. An introduction portion 10, the width of the passage thereof is narrowed, is provided in a predetermined area continued from the feed-in opening 8 of the irradiation chamber 4, and a derivation portion 11, the width of the passage thereof is narrowed, is provided in a predetermined area continued to the feed-out opening 9. A processing portion 12, the width of the passage thereof is made wider than that of the introduction portion 10 and the derivation portion 11 is provided Between the introduction portion 10 and the derivation portion 11, and above-described transmission window 6 is provided on the processing portion 12. The film F is wound-off from a wound-off roll 13, and fed to the introduction portion 10 of the irradiation chamber 4 from the feed-in opening 8 while guided by suitable number of feeding rollers 14. The film F fed to the irradiation chamber 4 is led to the processing portion 12, and the electron beam EB passed through the transmission window 6 at the processing portion 12 is irradiated to the surface of the film F. The film F after electron-beam irradiated passes the derivation portion 11 and is fed out from the feed-out opening 9, further is wound up by the wound up roll 16 while guided by appropriate number of feeding rollers 15. In the following, as the basis for the traveling direction V of the film F, the direction toward the wind-up roll 13 is sometimes called as the upstream about the film traveling direction, and the direction toward the wind-off roll 16 is sometimes called as the downstream about the film traveling direction. The irradiated object F may be the thing to which some processing is conducted by the irradiation of the electron beam EB, however, the description is continued assuming that the film of paper base material used as a wall paper.

On the movable wall 3*a* composing the irradiation chamber 4, it is provided blowing openings at the appropriate positions to introduce inert gas such as nitrogen into the interior of the room. For example, a first slit 20A and lot of gas supplying holes 20B are provided as blowing openings at the introduction portion 10, further, a second slit 20C as a blowing opening is provided at the vicinity of boundary between the introduction portion 10 and the processing portion 12. At the processing portion 12, a third slit 20D and a fourth slit 20E as blowing openings are provided so as to stride the transmission window 6 at the front and back direction. Further it is provided a lot of gas supplying holes 20F as blowing openings at the vicinity of the boundary between the derivation portion 11 and the processing portion 12. The first slit 20A and the second slit 20C are respectively provided so as to blow the inert gas to the film F over all width. By the inert gas blown from these slits 20A, 20C, the air accompanying the film F drawn into the introduction portion 10 is stripped off and forced to outside of the chamber from the feed-in opening 8. The gas supplying holes 20B is provided between the film F and the movable wall 3*a* to restrain a flapping of the film F by forming the support layer of the inert gas for pressing down the film F. In the following, when the slits 20A, 20C to 20 E, the gas supplying hole 20B, 20F do not have be judged each other, they sometimes be described as blowing openings 20A-20F.

Return to FIG. 1, on the electron beam irradiation device 1, it is provided a supply line 22 for supplying the inert gas from tank 21 as a source of supply of the inert gas to the blowing openings 20A-20F. The supply line 22 comprises a main line 23 used in common for all blowing openings 20A-20F and branch pipe lines 24A-24F to connect the main line 23 and the blowing openings 20A-20F respectively. Subscripts A-F of the branch pipe lines 24A-24F corresponds to subscripts A-F of the blowing openings 20A-20F. It is provided a control valve 25 on the main line 23 as a flow regulating valve controlling flow rate of the inert gas led to each branch pipe lines 24A-24F from the tank 21. It is provided assistant control valves 26A-26F as control valves for branch pipe lines controlling flow rate of each branch pipe lines 24A-24F on each of the branch pipe lines 24A-24F. It is provided the electromagnetic proportional controlling valve capable of regulating the flow rate by changing the valve travel proportionally on the main control valve 25. Each of the assistant control valve 26A-26F may be an opening-and-shutting valve switchable between two positions of an opened position and a closed position or electromagnetic proportional controlling valve.

Further, in vicinity of the third slit 20D, in other words, adjacent to the transmission window 6, a plurality of (three in figures) gas intake openings 30L, 30C and 30R are provided along the width direction of the film F. The gas intake opening 30C is located in the center of the width direction of the film F, the gas intake openings 30L, 30R of the right and the left are located in the vicinity of both ends of the width direction of the film F. In the following, when it is not necessary to judge the gas intake openings 30L, 30C and 30R, these are described as gas intake openings 30.

An oxygen concentration observation system 31 is connected to each of the gas intake opening 30. In FIG. 1, only an oxygen concentration observation system 31 for the gas intake opening 30R of the right side is shown, however, the oxygen concentration observation systems 31 of the same configuration are connected to each of other gas intake openings 30C, 30L respectively. The oxygen concentration observation system 31 comprises, sampling pipe line 32 for taking gas of the irradiation chamber 4 from the gas intake opening 30, a filter 33 for removing dust in the gas taken to the sampling pipe line 32, a pressure sensor 34 for detecting the pressure (filter second pressure) of the gas at the downstream (secondary side) of the filter 33, a oxygen concentration meter 35 for detecting the oxygen concentration in the gas at the downstream of the filter 33, a pump 36 for drawing the gas in the irradiation chamber 4 into the sampling pipe line 32, and a flow meter 37 for detecting the flow rate of the gas discharged from the pump 36. A cartridge type filter is used for the filter 33 so as to be changed easily. A flow meter 37 is provided so that an operator can confirm whether the gas of flow rate within the range that the oxygen concentration meter 35 can work normally flows through the sampling pipe line 32.

The pressure signal and the oxygen concentration signal which the pressure sensor 34 and the oxygen concentration meter 35 output respectively are input into a control unit 40 of the electron beam irradiation device 1. The control unit 40 conducts such as irradiation control of the electron beam by the electron beam generator 5, traveling control of the film F, flow control of the inert gas introducing from the blowing openings 20A-20F so that the electron beam is irradiated to the film F under a predetermined condition.

Figure 3:
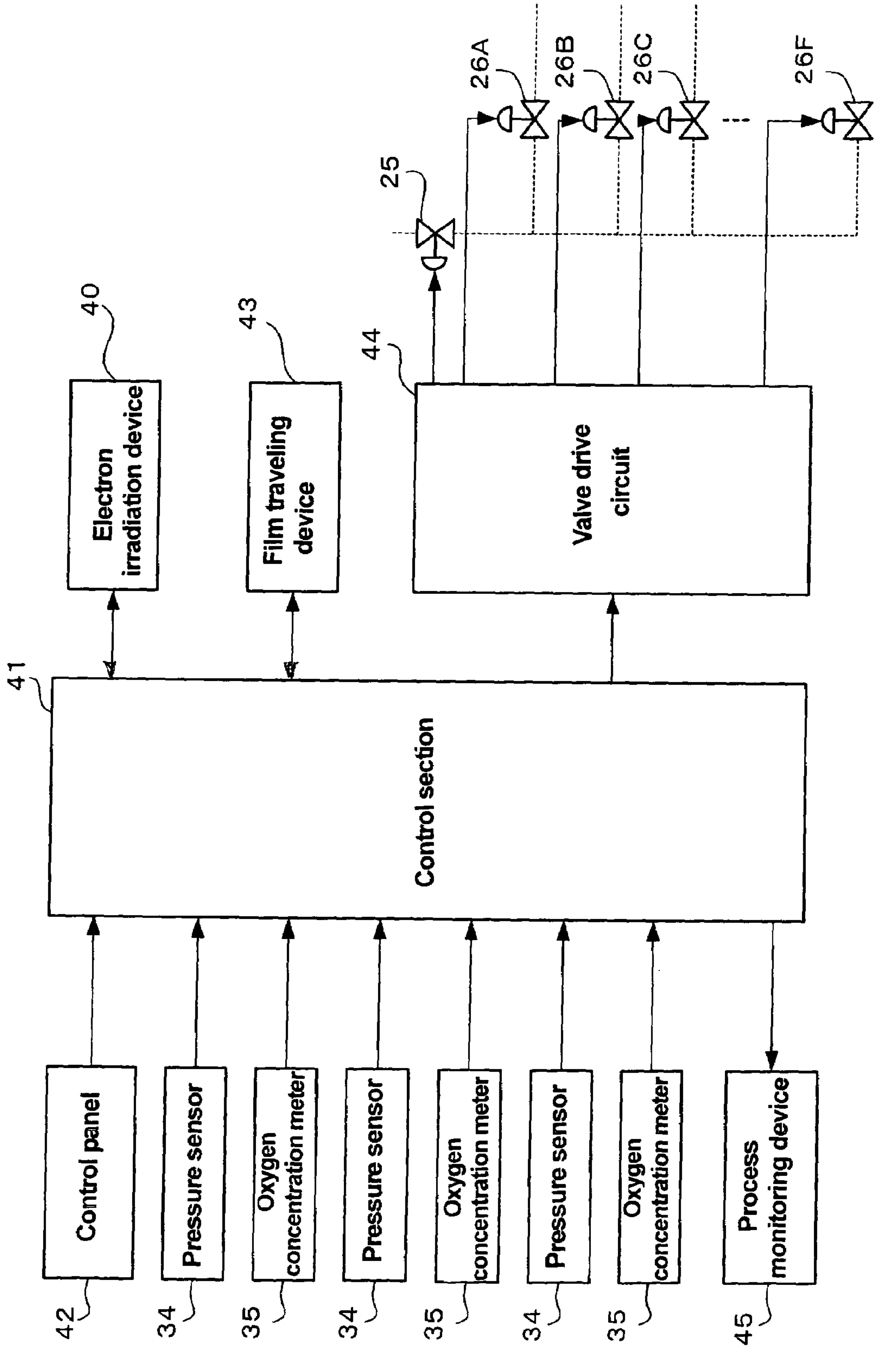
FIG. 3 is a functional block diagram of a control unit provided on the electron beam irradiation device.

FIG. 3 is a functional block diagram of the control unit 40. The control unit 40 has a control section 41 executing various processing which is necessary for an irradiation of the electron beam to the film F. The control section 41 is constructed as a control device which utilizing a microprocessor or a logical circuit such as LSI. The pressure sensors 34 and the oxygen concentration meters 35 of the above-described oxygen concentration observation systems 31 are connected to the control section 41, and a control panel 42 is connected as the device which the operator of the electron beam irradiation device 1 inputs the operating condition such as traveling speed of the film F. The electron beam generator 5, a film traveling device 43 and a valve drive circuit 44 are connected to the control section 41 as control object devices. The control section 41 provides instructions to the electron beam generator 5 and the valve driving circuit 44 according to the operating condition instructed from the control panel 42. The electron beam generator 5 generates an electron beam according to an indication from the control section 41. The film traveling device 43 make the film F travel by rotating and driving such as wind-up roll 16 according to the indication from the control section 41. The valve drive circuit 44 controls the main control valve 25 and the assistant control valves 26A-26F to switch according to the indication from the control section 41.

In the control panel 42, as a mode of an operation of the electron beam irradiation device 1, a standby mode, an arranging operation mode and a continuous operation mode are selectable. When the standby mode is instructed from the control panel 42, the control section 41 stops the electron beam irradiation from the electron beam generator 5 and stops the traveling of the film F by the film traveling device 43. On the other hand, when a continuous traveling mode from the control panel 42 is instructed, the control section 41 make the film F travel in a predetermined production rapidity (200 m/min., for example) which is set by the control panel 42 beforehand, and the electron beam of a predetermined energy quantity is irradiated from the electron beam generator 5 continually. The arranging operation mode is chosen when the preparation operation such as design matching, a color matching or cut & paste of the film F is conducted. In the arranging operation mode, the operator can instruct such as an irradiation condition of the electron beam or the traveling speed of the film F through the control panel 42 appropriately, the control section 41 controls the irradiation of the electron beam by the electron beam generator 5 and the traveling of the film F by the film traveling device 43 according to those indications.

The control section 41 decides the valve travel of the main control valve 25 and the assistant control valves 26A-26C on the basis of the pressure and the oxygen concentration which the pressure sensor 34 and the oxygen concentration meter 35 detects respectively in any mode of the standby mode, the arranging operation mode or the continuous operation mode, and sends the decided valve travel to the valve drive circuit 44 and controls the valve travel of these control valves 25, 26A-26C. However, in the decision of the valve travel, the traveling speed of the film F by the film traveling device 43 is also considered, but the details are mentioned later.

Further, a process monitoring device 45 is connected to the control section 41. The process monitoring device 45 is provided for monitoring the irradiation quality of the electron beam. The control section 41 acquires the state quantity which is necessary for monitoring the manufacturing process, such as the acceleration voltage of the electron beam generator 5, the beam current, the traveling speed of the film F by the film travel device 43, the oxygen concentration detected by the oxygen concentration meter 35 from the electron beam generator 5 and the film travel device 43, and output these state quantity to the process monitoring device 45. The process monitoring device 45 records a temporal change of the state quantity which received from the control section 41, and displays the record content to a display unit (not shown) such as a monitor.

Figure 4:
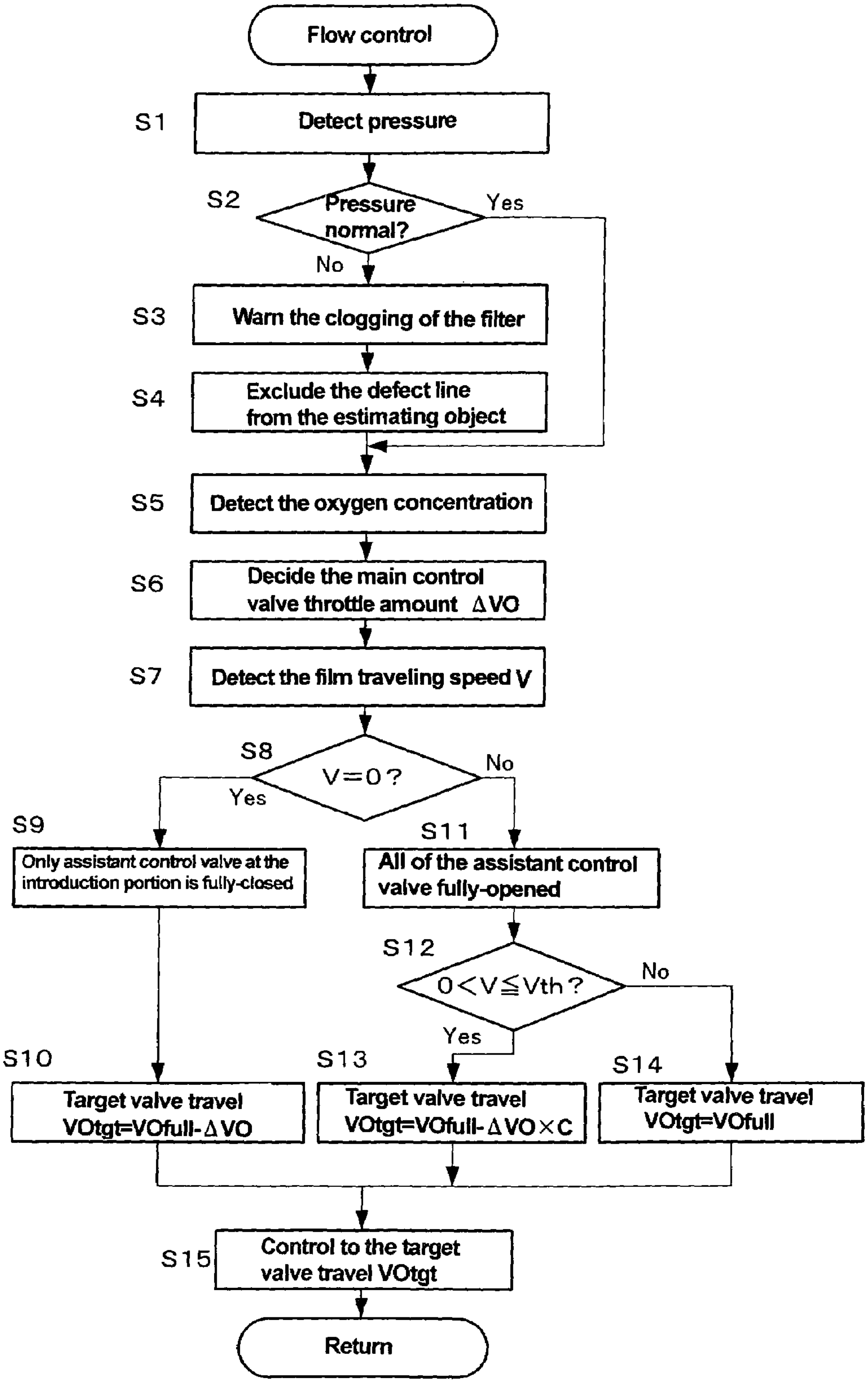
FIG. 4 is a flow chart showing a procedure of the flow control that the controlling part of a control unit executes.

FIG. 4 is a flow chart showing a procedure of the flow control processing which the control section 41 executes in appropriate cycle repeatedly for controlling the flow rate of the inert gas by operating the control valves 25, 26A-26C. In the flow control processing in the figure, at first, in the step S1, the control section 41 takes the output signal of the pressure sensor 34 and detects the filter second pressure of each sampling pipe line 32, and in the next step S2, judges whether each pressure is insufficient. This is the processing to judge whether the filter 33 functions normally. When the second pressure in either filters 33 is insufficient in the step S2, the control section 41 judges that the clogging occurs in the filter 33 and advances to the step S3, send a warning to the operator of the clogging of the filter 33 by the predetermined alarm device (for an example, a process monitoring device 45, or a buzzer and a lamp attached thereof), and in the following step S4, excludes the sampling pipe line 32 judged as the filter 33 is clogged from the estimating object of the oxygen concentration. Due to the processing of the step S2, the control section 41 functions as the filter monitor of the present invention, and due to the processing of step S3, the control section 41 functions as an alarm device of the present invention. On the other hand, when all the second pressures of the filters 33 are judged as a normal in the step S2, steps S3 and S4 are skipped.

In the next step S5, the control section 41 takes the output of the oxygen concentration meter 35 of the sampling pipe line 32 judged as the second pressure of the filter 33 is normal and detects the oxygen concentration. In this case, when there are detected values of a plurality of oxygen concentration meters 35, the mean value of those is acquired as oxygen concentration in the irradiation chamber 4. However, the maximal value may be used, and when there are lots of oxygen concentration meters 35, the oxygen concentration in the irradiation chamber 4 may be judged by various values such as a median value or a mode value which are determined by the statistical technique.

Figure 5:
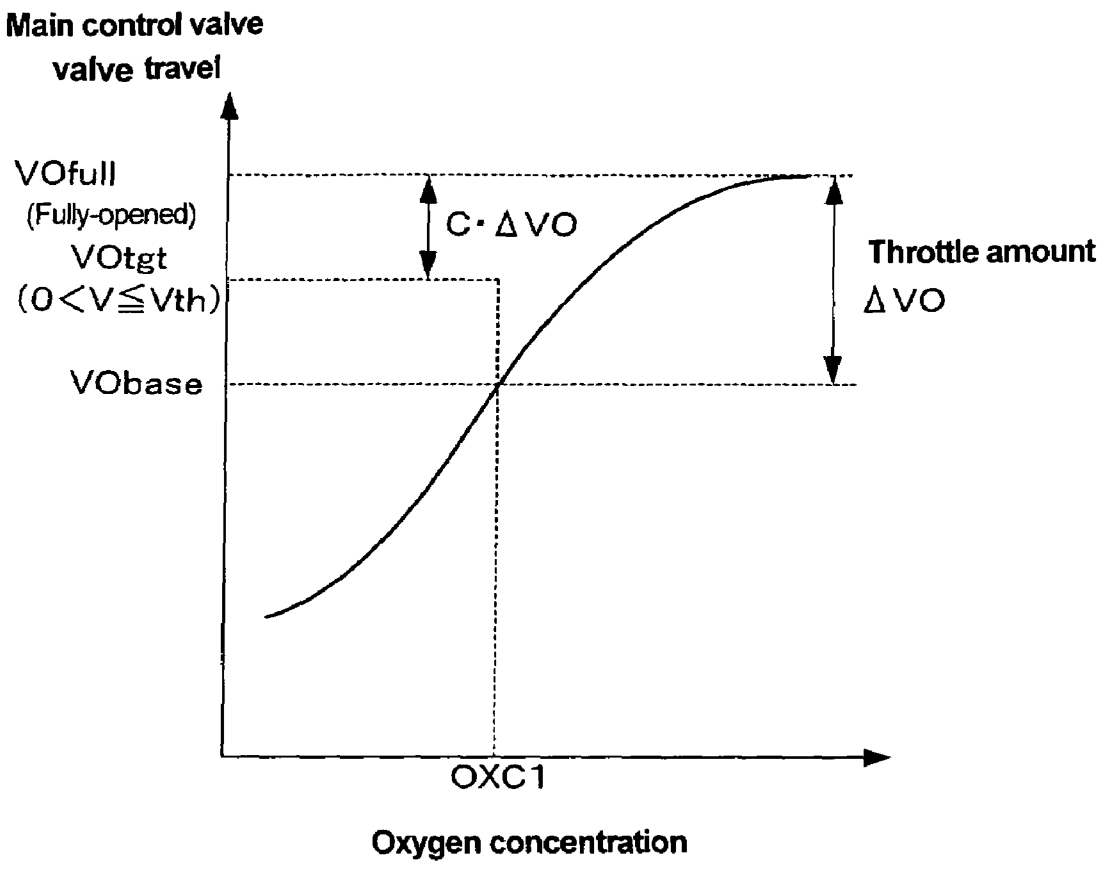
FIG. 5 is a view for describing the decision of the valve travel of the main control valve in the flow control.

In the following step S6, the control section 41 decides the throttle amount ΔVO from the fully-opened position of the main control valve 25 on the basis of the detected value of the oxygen concentration. That is, as shown in FIG. 5, the correspondence between the oxygen concentration and the appropriate valve travel of the main control valve 25 is obtained beforehand, utilizing this correspondence, the valve travel which the oxygen concentration detected in the step S5 is corresponding to OXC1 is determined as a basis valve travel VObase. And, the difference between the valve travel VOfull at the fully-opened state and the basic valve travel VObase of the main control valve 25 (=VOfull−VObase) is decided as the throttle amount ΔVO. As shown in FIG. 5, the relation between the oxygen concentration and the basic valve travel VObase of the main control valve 25 is determined so that the valve travel decrease when the oxygen concentration deteriorates, however, the changing manner may be set appropriately in consideration of the responsibility of the oxygen concentration for the flow control.

Next, the control section 41 acquires the traveling speed V of the film F in the step S7, further in the step S8, whether traveling speed V is zero is judged. When the traveling speed is zero, that is the film F stops or the film F is not introduced, go to the step S9, and the control section 41 controls only assistant control valves 26A-26C corresponding to the blowing openings 20A-20C of the introduction portion 10 to fully-opened state. Thereby, the introductions of the inert gas from the first slit 20A, the second slit 20C and the gas supplying hole 20B are stopped. Because there is no risk that the air is break in accompanying the film F when the film F does not travel. Other assistant control valves 26D-26 F are controlled to the fully-opened state, and the inert gas is introduced into the irradiation chamber 4 from the third slit 20D, the fourth slit 20E and the gas supplying hole 20F.

In the following step S10, the control section 41 sets the target valve travel VOtgt of the main control valve 25 to the value travel which are obtained by subtracting the throttle amount ΔVO from the valve travel VOfull of fully-opened state. In this case, the target valve travel VOtgt of the main control valve 25 corresponds to the basic valve travel VObase shown in the FIG. 5. On the other hand, when the traveling speed V is not zero in the step S8, the control section 41 goes to the step S11 and all the assistant control valves 26A-26F are controlled to fully-opened state. In the following step S12, the control section 41 judges whether the traveling speed V of the film F is bigger than zero and lower than the threshold Vth. The threshold Vth is given as the reference value judging whether the flow rate of the inert gas is decreased corresponding to the lowering of the oxygen concentration. The threshold Vth is set to the value lower than the lower limit of the production velocity when the film F traveling in the above-described continuous irradiation mode and higher than the upper limit of the traveling speed instructed in the arranging operation mode.

When the step S12 is affirmed, the control section 41 advances to the step S13, and the target valve travel VOtgt of the main control valve 25 is set to the value provided in the next equation. VOtgt=VOfull−ΔVO×C Wherein C is a correction-ratio for restricting the throttle amount ΔVO into the width smaller than that when the film is stopped, 0<C<1. That is to say, in the step S13, the target valve travel VOtgt is set grater than the basic valve travel VObase given as the target valve travel VOtgt of when the film is stopped. When the film F travels, the oxygen concentration is easy to rise by entering of the accompanying air in comparison with when the film F is stopped, on the other hand, the response delay of the flow control corresponding to the detected value of the oxygen concentration occurs, therefore, when the speed of the film F in low, it is preferable to restrain the decreasing width of the flow rate smaller than that when the film F is stopped for keeping the oxygen concentration in acceptable limit.

On the other hand, when the step S12 is negatively judged, the control section 41 advances to the step S14, and the target valve travel VOtgt of the main control valve 25 is set to the valve travel VOfull of the fully-opened state. When the step S12 is negatively judged, because the film F travels at the production speed and the irradiation of the electron beam is conducted, in this case it is preferable to give priority to the prevention of the rise of the oxygen concentration over the reduction of the quantity of inert gas used, therefore, regardless of the oxygen concentration, the main control valve 25 is maintained in fully-opened state. When the film F consists of the paper backing, because the paper powder occurs by the irradiation of electron beam and the irradiation chamber 4 is polluted, it is preferable to set the flow rate of the inert gas greatly as much as possible. As described above, after having set the target valve travel VOtgt of the main control valve 25, the control section 41 controls the main control valve 25 to the target valve travel VOtgt in the step S15, afterwards, the processing of FIG. 4 is finished. In the step S15, in addition to the proportional control on the basis of the deviation of the given target valve travel VOtgt and the current valve travel, the derivation control and the integral control may be conducted. By executing above-described steps S5-S15, the control section 41 functions as a valve travel control device of the present invention.

According to the above-described processing, if the oxygen concentration drops when the film F is stopped or traveled low speed (V<Vth), the target valve travel VOtgt of the main control valve 25 decreases, and the flow rate of the inert gas introduced into the irradiation chamber 4 is throttled. Thereby, the oxygen concentration is maintained in an acceptable limit while wasteful consumption of the inert gas is suppressed, and amount thereof can be reduced. In particular, when the film F is stopped, because the blowing of the inert gas in the introduction portion 10 is stopped, the reduction effect of quantity of the inert gas consumed is small. When the film F travels at low speed, in comparison with the speed when it is stopped, because the target valve travel VOtgt of the main control valve 25 for the same oxygen concentration is set to the higher value, it can be prevented that a rise of the oxygen concentration caused by the response delay of the control while suppressing the wasteful consumption of the inert gas. Further, when the film F traveling in the production velocity and the electron beam is irradiated, even if the oxygen concentration drops, the target valve travel VOtgt of the main control valve 25 is maintained in the valve travel VOfull of the fully-opened state and the oxygen concentration in the irradiation chamber 4 is controlled in minimum, therefore, there is no risk that the irradiation quality of the electron beam deteriorates.

In above-described embodiment, a plurality of gas intake openings 30C, 30L, 30R are arranged in the width direction of the film F and the oxygen concentrations in the middle and the both ends of the width direction portion of the film F are detected, therefore comparing to the case in which an oxygen concentration is detected only one place, the detection accuracy of the oxygen concentration in the irradiation chamber 4 improved, and the flow rate of the inert gas can be controlled more adequately. In addition, the pressure at the downstream of the filter 33 is detected and the clogging of the filter 33 is judged, then the sampling pipe line 32 in which a clogging is generated is excluded from the estimating object of the oxygen concentration, therefore, there is no risk that the error is generated in the flow control of the inert gas caused by the clogging of the filter 33. By the way, when the filter 33 is clogged, the oxygen concentration at the downstream of the filter 33 rises, in the case that the flow rate of the inert gas is controlled in response to the oxygen concentration, the inert gas is introduced more than required and a waste occurs to the quantity consumed. According to the embodiment, there is no risk that such a waste generates. Further, because an alarm is output when a clogging of the filter 33 is detected, maintenance of the filter 33 can be promoted to the operator. Therefore, the risk that the operator does not realize the state in which an error is generated in the detected value of the oxygen concentration because of the clogging of the filter 33 and that he/she does not ignored can be removed.

The present invention is not limited to above described embodiment and can be carried out in various kinds of embodiment. The variations of above-described embodiment are explained in the following.

In the above-described embodiment, as far as the clogging is not generated in the filter 33, all the sampling pipe lines 32 connected to each gas intake openings 30C, 30L, 30R at the three places are intended to be the objects for estimate, but the number of the object for estimating may be changed in response to the width of the film F. For example, when the width of the film F is small and the gas intake openings 30L, 30R of both ends are positioned outside of the film F, flow control is conducted on the basis of only the oxygen concentration in the gas taken to the sampling pipe line 32 from the central gas intake opening 30C, on the other hand, when all the gas intake openings 30C, 30L, 30R face to the film F, the oxygen concentration in the gas taken into all the sampling pipe lines 32 may be detected and the flow control on the basis of mean value may be conducted. In this case, the width of the film F is input from the control panel 42, in response to the input value, the control section 41 may choose the sampling pipe line 32 of the object for estimating.

In above-described embodiment, the main control valve 25 is maintained in fully-opening state during continuous irradiation, however, the present invention is not a limited to this, during the electron beam is irradiated while the film F is traveling, the flow control of the inert gas in response to the oxygen concentration may be conducted. For example, in case that the film F consisting of the materials which does not generate a dust such as a paper powder (for example, a film of a resin backing), even in the continuous irradiation, the flow rate of the inert gas may be throttled in response to the decreasing of the oxygen concentration.

In above-described embodiment, the setting of the target valve travel VOtgt of the main control valve 25 is changed corresponding to three phases of the stopped phase, the low speed transit-phase, and the continuous irradiation phase of the film F, however, the present invention is not limited to this, the target valve travel VOtgt may be controlled more finely. For example, as traveling speed of the film F rises, by decreasing the correction-ratio C, the target valve travel VOtgt under the same oxygen concentration may be continuously changed according to the change of the traveling speed V. When the responsibility of the flow control of the inert gas for the change of the oxygen concentration is secured enough, the flow control in consideration of the traveling speed is omitted, regardless of the traveling speed, the flow rate of the main control valve 25 may be controlled according to the relation between the oxygen concentration and the basic valve travel VObase which illustrated in FIG. 5.

The control of the flow rate of the inert gas does not limit to the one realized by the main control valve 25. For example, by omitting the main control valve 25 and by changing the valve travel of the assistant control valves 26A-26F individually on the basis of the oxygen concentration, the flow rate of the inert gas introduced into each place of the irradiation chamber 4 may be controlled. The layout of the gas intake opening does not limit to the example in which it is arranged in the width direction of the film F in the position adjacent to the transmission window 6. For example, the gas intake openings are provided on a plurality of positions as for the traveling direction of the film F, and the oxygen concentration distribution in the irradiation chamber 4 are judged more finely, then in response to the discriminate result, each valve travel of the assistant control valves 26A-26F may be controlled individually.

In above-described embodiment, when the film F is stopped, the introductions of the inert gas from the first slit 20A, the second slit 20C and gas supplying hole 20B are stopped, however by throttling the valve travel of the assistant control valves 26A-26C to the extent not get to the fully-closed state, an amount of the inert gas less than that of in the low speed traveling or in the continuous irradiating may be supplied from those blowing openings 20A-20C. However, the flow control of the inert gas utilizing the assistant control valve 26A-6C may be omitted, and the position and number of blowing opening which becomes the object for controlling can be changed depending on the configuration of the irradiation chamber 4 appropriately. Further, for a plurality of blowing openings in the introduction portion 10, an assistant control valve can be used commonly and the valve travel may be controlled.

What is claimed is:

1. An electron beam irradiation device, comprising:

an electron beam to irradiate an irradiated object passing through an irradiation chamber while introducing an inert gas into the irradiation chamber;

an oxygen concentration detection device to detect oxygen concentration in the irradiation chamber;

a flow regulating valve to regulating flow rate of the inert gas introducing in the irradiation chamber; and a valve travel control device to control valve travel of the flow regulating valve on the basis of the oxygen concentration detected by the oxygen concentration detection device so that the flow rate of the inert gas decreases when the oxygen concentration becomes low, wherein the valve travel control device changes the relation between the oxygen concentration and the valve travel of the flow regulating valve corresponding to the speed of the irradiated object so that flow rate of the inert gas for the same oxygen concentration when the speed of the irradiated object is high becomes relatively bigger than the flow rate when the speed of the irradiated object is low, and, the valve travel control device is configured to control the flow regulating valve such that the valve travel is set to a fully-opened state when the speed of the irradiated object exceeds a predetermined value irrespective of the oxygen concentration, that the valve travel is set to a basic valve travel, which is determined according to the oxygen concentration, when the speed of the irradiated object is zero, and that the valve travel is set to an opening degree smaller than that of the fully-opening state and larger than that of the basic valve travel at the same oxygen concentration when the speed of the irradiated object is larger than zero and smaller than the predetermined value.

* * * * *